(12) United States Patent
Daub

(10) Patent No.: US 9,136,759 B2
(45) Date of Patent: Sep. 15, 2015

(54) DC-DC CONVERTER WITH CIRCUIT FOR REPRODUCING A CURRENT FLOWING THROUGH A STORAGE INDUCTOR

(75) Inventor: Wolfgang Daub, Anröchte (DE)

(73) Assignee: Hella KgAA (DE)

( * ) Notice: Subject to any disclaimer, the term of this patent is extended or adjusted under 35 U.S.C. 154(b) by 0 days.

(21) Appl. No.: 13/981,529

(22) PCT Filed: Dec. 5, 2011

(86) PCT No.: PCT/EP2011/071723
§ 371 (c)(1),
(2), (4) Date: Aug. 11, 2014

(87) PCT Pub. No.: WO2012/076457
PCT Pub. Date: Jun. 14, 2012

(65) Prior Publication Data
US 2014/0347029 A1 Nov. 27, 2014

(30) Foreign Application Priority Data
Dec. 6, 2010 (DE) .......... 10 2010 061 042

(51) Int. Cl.
*H02M 3/156* (2006.01)
*G01R 19/00* (2006.01)
*H02M 3/158* (2006.01)
*H02M 1/00* (2007.01)

(52) U.S. Cl.
CPC .......... *H02M 3/156* (2013.01); *G01R 19/0092* (2013.01); *H02M 3/1582* (2013.01); *H02M 2001/0009* (2013.01)

(58) Field of Classification Search
USPC ........................ 323/222, 232, 272, 282–290
See application file for complete search history.

(56) References Cited

U.S. PATENT DOCUMENTS

| 5,498,984 A | 3/1996 | Schaffer |
| 8,773,879 B2 * | 7/2014 | Gan et al. .................. 363/127 |
| 2005/0012689 A1 * | 1/2005 | Abdoulin ..................... 345/60 |
| 2006/0044843 A1 | 3/2006 | Oswald et al. |
| 2008/0048645 A1 | 2/2008 | Leibl |
| 2009/0267582 A1 | 10/2009 | Prodic et al. |
| 2010/0131219 A1 | 5/2010 | Kenly et al. |

OTHER PUBLICATIONS

International Preliminary Report and Written Opinion regarding International Application No. PCT/EP2011/071723.

* cited by examiner

*Primary Examiner* — Jessica Han
(74) *Attorney, Agent, or Firm* — Husch Blackwell LLP

(57) ABSTRACT

The present invention relates to a circuit for emulating a current via a power inductor of a DC-to-DC converter. The circuit is able to generate a first signal and detect or emulate the constant component of the current by using a power inductor. The circuit is also able to generate a second signal or components of a second signal and emulate an alternating component of the current by using the power inductor. The circuit also is able to splice the first and second signal or the first signal and components of the second signal into a signal which at least partially emulates the current via the power inductor. The circuit able to generate a first signal may include a current sensing resistor connected to the power inductor and a first capacitor, and to a first input and output.

10 Claims, 2 Drawing Sheets

DC-DC CONVERTER WITH CIRCUIT FOR REPRODUCING A CURRENT FLOWING THROUGH A STORAGE INDUCTOR

CROSS REFERENCE

This application claims priority to PCT Application No. PCT/EP2011/071723, filed Dec. 5, 2011, which in turn claims priority to German Application No. 10 2010 061 042.9, filed Dec. 6, 2010, each of which are incorporated by reference in their entirety herein.

TECHNICAL FIELD OF THE INVENTION

The invention relates to a circuit for the purpose of at least partially emulating a current via a power inductor of a DC-to-DC converter, particularly of a bidirectional DC-to-DC converter, for example a bidirectional synchronous converter, having a first input and/or output for the purpose of connection to a first power grid, and having a second input and/or output for the purpose of connection to a second power grid.

BACKGROUND OF THE INVENTION

A bidirectional synchronous converter, which can also be called a "buck-boost" converter, is known from DE 696 34 709 T2. A circuit is also known which can be used to sense the current via the power inductor of the switch converter. Additional conventional circuits and methods of sensing current are mentioned in the document. The document also addresses problems with these known methods and circuits for sensing the current by the switch converter.

The conventional circuits and methods are based on two different principles, specifically the sensing of the current via a current sensing resistor, and the sensing of the current by means of a transformer and a current sensing resistor in a secondary circuit of the transformer.

The disadvantages of the two principles will now be addressed briefly.

When a current sensing resistor is used, it is advantageous that only currents with frequencies which are a great deal smaller than the limit frequency $fg=R/2pi*Lp$ are sensed, wherein Lp is the parasitic inductance of the current sensing resistor, and R is the resistance of the current sensing resistor. For high currents, low-resistance current sensing resistors are required in order to keep power dissipation low. This results in small limit frequencies.

However, it is advantageous for DC-to-DC converters [to have] switching frequencies, which are also called conversion frequencies, in the range from 100 to 1000 kHz. Only in this case is it possible to obtain satisfactory degrees of efficiency and constructed sizes at a reasonable cost. Otherwise, expensive throttles and complex filter elements are necessary in order to achieve the necessary protection from electromagnetic radiation (EMC).

The dependence of the current sensing resistor on frequency can be compensated with filter circuits if the parasitic inductance is known and is specified by the manufacturer. However, this is not generally the case. Therefore, it is generally not possible to make this compensation.

As an alternative, in order to achieve high limit frequencies, high-resistance current sensing resistors could be used. However, this results in high power dissipation. An additional cooling is then also necessary.

The sensing of current by means of a transformer and a current sensing resistor in the secondary circuit, which is particularly also disclosed in DE 696 34 709 T2, makes it necessary to acquire an expensive transformer.

The publication "LM5116 Wide Range Synchronous Buck Controller" from Dec. 8, 2008, published by the National Semiconductor Corporation, discloses a circuit (page 11 of the publication) by means of which the current is not sensed but rather is emulated by a power inductor of a DC-to-DC converter, which is a synchronous DC-to-DC converter. A current sensing resistor is arranged in the DC-to-DC converter and is in series with the power inductor, at least chronologically, wherein the coil current is then fed through the current sensing resistor. The constant component of the voltage which drops across the current sensing resistor is sensed by means of a holding element. The alternating component of the coil current, in contrast, is derived from a voltage difference between the voltage at the input and the voltage at the output of the DC-to-DC converter.

The circuit therefore comprises
a first means for generating a first signal, said means sensing the constant component of the current, wherein the first means has first elements for generating the first signal,
a second means for generating a second signal, said second means emulating the alternating component of the current, and
a third means for splicing the first signal and the second signal into a signal which at least partially emulates the current via the power inductor.

The sensing of the constant component of the current via the power inductor, by means of the current sensing resistor at the point indicated on page 11 of the named publication, has the following disadvantage:

The current sensing resistor, indicated by $R_S$ in the diagram on page 11 of the publication, has (in a simplified view) a parasitic series inductance and a parasitic shunt capacitance. It forms an oscillating circuit which is stimulated by the discontinuous current signal. If the MOSFET, indicated by Q1 in the diagram on page 11 of the publication, is switched off, this has the result that the voltage at the node SW where the power inductor L1 is connected to the two MOSFETs Q1, Q2 reverses sign and becomes more negative than the base potential. At this point, the MOSFET Q2 is forced to switch (the parasitic parallel diode of the MOSFET Q2 starts conducting). The signal at the current sensing resistor demonstrates a self-oscillating behavior according to the final switching times of the MOSFET, the MOSFET capacitances, the switch-on delay of the MOSFET Q2, the storage effect of the lower parasitic diode of the MOSFET Q2, the non-ideal power inductor L1, and the parasitic elements of the current sensing resistor R, itself. The amplitude of this self-oscillation can be many times the desired signal. The working resistance of the current sensing resistor $R_S$ must therefore be made as high as possible so that a useable signal-to-noise ratio results. The sampling of the signal by means of a sample and hold circuit is increasingly difficult at smaller resistance values, because the sampling takes a certain amount of time. During this time, the signal being sampled should not vary. In addition, at higher conversion frequencies, the self-oscillating behavior persists longer than the time during which the MOSFET Q2 is conductive. In this case as well, the sampled signal cannot be used.

SUMMARY OF THE INVENTION

The problem addressed by the invention is that of improving this circuit in such a manner that it is possible to use no, or low-resistance, current sensing resistors, that high conversion frequencies can be used, that it is possible to dispense with filter circuits used to compensate parasitic elements of the current sensing resistor, and that the circuit can be manufactured in a cost-effective manner.

This problem is addressed by a configuration wherein the first elements of the first means comprise a current sensing resistor, wherein the current sensing resistor is connected on the one hand to the power inductor and a first capacitor, and on the other hand to the first input and output.

Instead of the current being measured via the power inductor, the current is emulated via the power inductor from other electrical parameters, which can be detected using simple means, by means of the circuit according to the invention. This emulation of the current via the power inductor is of such a high quality in many cases that it is possible to dispense with a precise measurement of the current, along with all of the associated disadvantages. In this case, the emulation only partially corresponds to the actual choke current, wherein the emulation of the choke current is correctly emulated in the segments which are significant for the further processing.

The following emphasized considerations are the basis of one embodiment of the first means for generating the first signal, said means detecting the constant component of the current via the power inductor.

Instead of using a current sensing resistor to detect the complete current via the power inductor, the current sensing resistor is only used to sense the constant component of the current via the power inductor, and to convert the sensed current into the first signal which corresponds to the current. A detection of the alternating component of the current via the power inductor, by means of the current sensing resistor, is not necessary. It is possible to avoid the problems which typically arise in the sensing of the alternating component. The alternating component of the current is preferably sensed at a point where preferably only a direct current flows. This can be, by way of example, the current via the first input and/or output.

On the basis of these considerations, for designing the first means for generating the first voltage which corresponds to the constant component of the current via the power inductor, the first elements for generating the first signal are suggested, the same detecting an average of the current via the power inductor—that is, the constant component. The first signal is generated from the detected current, and corresponds to the constant component of the current via the power inductor. The first elements are part of the first means for generating the first signal.

The first elements of the first means have two transconductance amplifiers which are connected in antiparallel, wherein the voltage which drops across a current sensing resistor is fed to the inputs of the transconductance amplifiers. The constant component of the current, the same filtered by means of the current sensing resistor and a capacitor, flows through the power inductor through the current sensing resistor. The voltage across the current sensing resistor, which can be one of the first elements of the first means for generating the first signal, can be converted by one of the two transconductance amplifiers into a current. Which of the two transconductance amplifiers converts the voltage into the current depends on the direction in which the current flows through the current sensing resistor. The output current of the transconductance amplifier or amplifiers can be fed via a parallel circuit consisting of a resistor and a capacitor to ground. The current can be smoothed by means of the capacitor of the parallel circuit. By means of the resistor, it is possible to convert the current smoothed by the capacitor into a voltage. This voltage can form the first signal, which corresponds to the direct current via the power inductor.

The following emphasized considerations form the basis for one embodiment of the second means for generating the second signal, said means detecting the alternating component of the current via the power inductor, or the components of such a second signal.

The second signal, which represents the alternating component of the current via the power inductor, can be obtained by integrating a signal which emulates the voltage via the power inductor, because, as is known, the voltage via an inductor corresponds to the shunting of the current via the inductor ($U=L*dI/dt$).

The second means therefore advantageously comprises elements for generating a third signal, which emulates the voltage via the power inductor. The third signal, which emulates the voltage via the power inductor can be formed from voltages applied at the first input and/or output of the DC-to-DC converter and/or at the second input and/or output of the DC-to-DC converter. The third signal is not the result of a sensing of the voltage via the power inductor. Rather, electrical parameters which can be easily detected are detected, and used to emulate the voltage via the power inductor.

For many applications, it is sufficient if only the voltage at the inductor resulting in a rise in the inductor current needs to be emulated. The integration of the voltage via certain periodic, repeating time intervals resembles a convolution in the time intervals of interest. Because only certain intervals of the "convoluted" signal are required, it is possible to set certain boundary parameters such that
offset values following the integration do not lead to a signal "runaway."

The voltage via the power inductor of the DC-to-DC converter can be emulated either by the difference in the voltages between the first input and/or output and the second input and/or output, or by the voltage at the first or at the second input and/or output, according to whether energy is transported, by the DC-to-DC converter, from the first input and/or output to the second input and/or output. In the case of a bidirectional synchronous DC-to-DC converter, the voltage via the power inductor is emulated during boost operation by the voltage at the first input and/or output, which then has the function of an input. During buck operation, it is emulated by the difference of the voltages between the first input and/or output and the second input and/or output, wherein the first input and/or output then has the function of an output, and the second input and/or output has the function of an input.

The elements for generating a third signal which emulates the voltage via the power inductor, can have a first operational amplifier, wherein the voltage applied at the first input or output is applied to said operational amplifier, said voltage being used during boost operation to generate the third signal. The first operational amplifier can be a voltage follower. The output of the first operational amplifier is preferably connected to a first node via a first controllable switch element. The first controllable switch element can be closed by a controller means during boost operation of the DC-to-DC converter.

The elements for generating the third signal can further have a second operational amplifier. The second operational amplifier can be regenerative. It can be connected as a differential amplifier. The voltage's used to generate the third signal during buck operation, which are applied at the first input and/or output and the second input and/or output, are advantageously applied to the inputs of the second operational amplifier. The output of the second operational amplifier provides the third signal and is preferably connected to the first node via a second controllable switch element. Instead of a differential amplifier, another subtractor can be used which allows the voltages at the inputs and/or outputs to be subtracted. The second controllable switch element can be closed by a controller means during buck operation of the DC-to-DC converter.

The second means can have elements for integrating the third signal, wherein a fourth signal can be generated by said means. The elements for the integration can have a current source which can be controlled by the third signal, and a parallel circuit, consisting of a controllable switch element and a capacitor, which is in series with the controllable current source. This controllable circuit element can be controlled by a controller means in such a manner that it is opened by the power inductor when the current increases, such that the capacitor is charged, wherein when the current drops, it is closed by the power inductor in order to discharge the capacitor. The voltage across the capacitor, which forms the fourth signal, cannot be directly used as the second signal, which emulates the alternating component of the current via the power inductor. The fourth signal emulates the value of the alternating component of the current via the inductor coil, which is shifted by the peak value of the alternating component. The second signal, which emulates the alternating component, can be generated from this fourth signal if the peak value of the alternating component is subtracted from the fourth signal.

The second means therefore comprise elements for generating a fifth signal, which emulates the peak value of the alternating component of the current via the power inductor. The fifth signal, which represents the peak value for the alternating component of the current via the power inductor, can be generated from the fourth signal, which has been formed by the integration. The elements of the second means for generating the fifth signal can also have a detector by means of which the oscillation width of the second signal is detected. A signal which can be generated by this detector can be halved by means of an operational amplifier with an amplification factor of 0.5, in order to then be used as the fifth signal which gives the peak value of the alternating component.

The third means for splicing the alternating component and the constant component can then have elements for subtracting the fifth signal from the fourth signal, to generate the second signal. The first and the second signal can then be added by an element for adding, in order to generate the signal which emulates the current via the power inductor.

As an alternative, and preferably, the fifth signal, which forms a first component of the second signal, can also first be subtracted from the first signal by means of a subtractor of the third means, in order to generate an auxiliary signal. The auxiliary signal is then spliced, by means of an adder of the third means, with the fourth signal, the same forming a second component of the second signal, in order to generated the signal which emulates the current. In this case, it is not necessary to form the second signal itself.

In an alternative circuit, a seventh signal is generated by separating the constant component from the fourth signal by means of a capacitor which is in series to the fourth signal. The seventh signal is then the alternating component of the fourth signal.

The first and seventh signals are passively added by their being connected to a node via two (identical) resistors. The voltage at the node is partially proportional to the inductor current. The seventh signal is a bipolar signal, but is only passively processed.

One disadvantage of the alternative circuit is that the circuit has a high-pass characteristic and can lead to an oscillation tendency in a closed feedback system. However, it may be possible to size the alternative circuit in such a manner that it functions like a phase boosting element, which would have a stabilizing effect in the closed feedback system as a result.

These aspects are merely illustrative of the innumerable aspects associated with the present invention and should not be deemed as limiting in any manner. These and other aspects, features and advantages of the present invention will become apparent from the following detailed description when taken in conjunction with the referenced drawings.

BRIEF DESCRIPTION OF THE DRAWINGS

Reference is now made more particularly to the drawings, which illustrate the best presently known mode of carrying out the invention and wherein similar reference characters indicate the same parts throughout the views.

DETAILED DESCRIPTION

In the following detailed description numerous specific details are set forth in order to provide a thorough understanding of the invention. However, it will be understood by those skilled in the art that the present invention may be practiced without these specific details. For example, the invention is not limited in scope to the particular type of industry application depicted in the figures. In other instances, well-known methods, procedures, and components have not been described in detail so as not to obscure the present invention.

Figure 1:
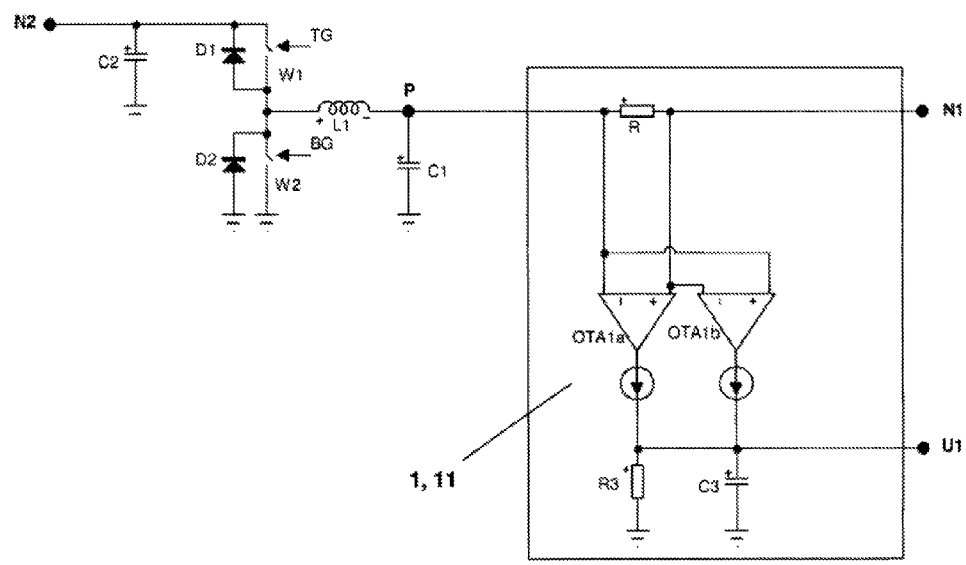
FIG. 1 is a portion of a circuit arrangement according to the invention, having a bidirectional synchronous DC-to-DC converter and a circuit according to the invention for emulating a current via a power inductor of the DC-to-DC converter.

The circuit arrangement according to the invention illustrated in FIG. 1 has a bidirectional synchronous DC-to-DC converter in a power component. In this power component and/or in the DC-to-DC converter, a voltage of a first power network is converted into the voltage of a second power network—or the voltage of the second network is converted into the voltage of the first network. The flow of energy can be controlled by a corresponding control of controllable switch elements W1, W2 of the DC-to-DC converter. In addition to the controllable switch elements W1, W2, the DC-to-DC converter has diodes D1, D2, a first capacitor C1, a power inductor L1, and a second capacitor C2, in a known arrangement parallel to the switch elements. A voltage can be connected to ground at a first input and output N1, as well as at a second input and output N2. The first input and output N1 is connected to a node P between the power inductor L1 and the first capacitor C1 via a current sensing resistor R.

Figure 3:
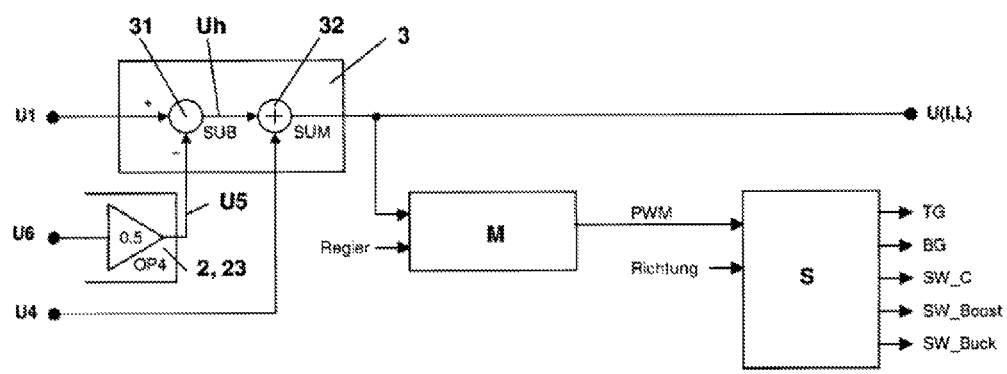
FIG. 3 is another portion of the circuit arrangement of FIG. 1.

The control of the controllable switch elements W1, W2 is achieved via a controller means S, as shown in FIG. 3.

The bidirectional synchronous DC-to-DC converter can be operated in the known manner in order to transmit energy from the first network to the second network, and vice-versa.

The circuit arrangement has, in addition to the power component, meaning the DC-to-DC converter, a circuit by means of which the current via the power inductor L1 of the DC-to-DC converter can be partially emulated.

The circuit has a first means 1 for partially emulating a constant component of the current flowing through the power inductor L1. In addition to this first means 1, the circuit has a second means 2 for emulating an alternating component of the current flowing through the power inductor L1.

The first means 1 have first elements 11 for generating the first signal, which corresponds to the sensed constant component of the current via the power inductor L1. The first elements 11 also have two transconductance amplifiers OTA1*a*, OTA1*b* connected in antiparallel, wherein the voltage which drops across the current sensing resistor R is fed to the amplifiers. According to the direction of current flow through the current sensing resistor R, current is generated by one or the other of the transconductance amplifiers OTA1*a*, OTA1*b*, which is smoothed and converted into a voltage by a parallel circuit consisting of a capacitor C3 and a resistor R3. The voltage which drops across this parallel circuit is supplied as the first signal U1.

Figure 2:
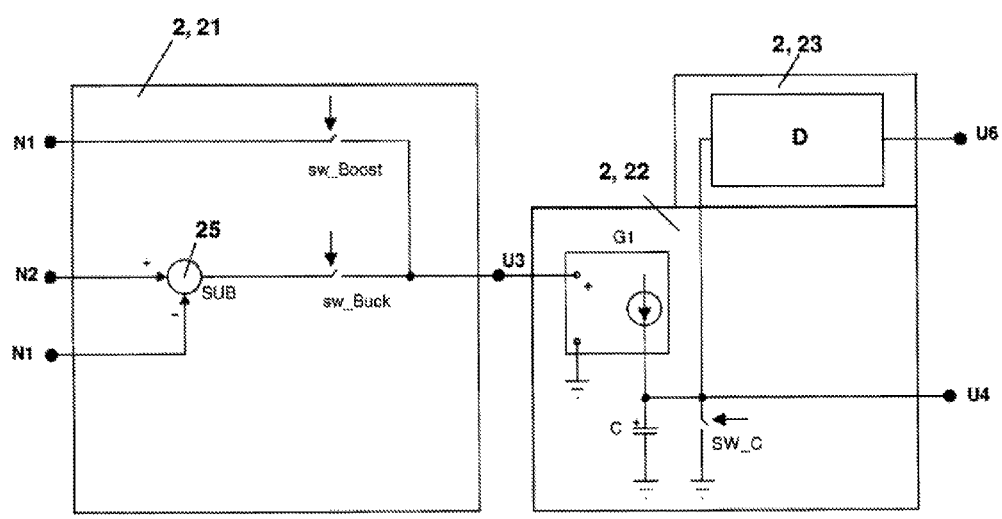
FIG. 2 is another portion of the circuit arrangement of FIG. 1.

The alternating component of the current flowing through the power inductor L1 is formed by the second means 2 as follows:

First, as shown in FIG. 2, a voltage signal U3, specifically the third signal the voltage which drops across the power inductor is emulated by elements 21 for emulating the voltage which drops across the power inductor L1. These elements comprise a controllable switch element sw_boost, which is closed by the controller means S during boost operation of the DC-to-DC converter. The voltage at the first input and/or output is then supplied to a node K of the circuit as the third signal U3.

The elements for emulating the voltage which drops across the power inductor L1 comprise a subtractor 25 which subtracts the voltage at the first input and/or output N1 from the voltage at the second input and/or output N2. The output of the substractor 25 is connected to the node K via a controllable switch element sw_buck. The controllable switch element sw_buck is closed during buck operation of the DC-to-DC converter by the controller means S. The output voltage of the subtractor 25 is then applied as the third signal U3 to the node K.

The third signal U3 is integrated by elements 22 for integration in order to generate a fourth signal. For this purpose, the third signal U3 controls a controllable current source G1, the current of which is fed via a parallel circuit consisting of capacitor C and a further controllable switch element SW_C. According to whether the current rises or falls via the power inductor 1, capacitor C is either charged when the controllable switch element SW_C is open, or is discharged via the closed controllable switch element SW_C. The opening and closing of the switch element SW_C takes places synchronously with the switching of the switch elements W1, and W2 of the DC-to-DC converter. The voltage across the capacitor C forms the fourth signal U4, which emulates an alternating component of the current via the power inductor L1, shifted by the peak value of the alternating component.

A sixth signal U6 is generated from the fourth signal U4 by means of detector D for detecting the oscillation width, said sixth signal representing the oscillation width of the fourth signal, as shown in FIG. 2. The oscillation width is halved by means of operational amplifier OP4 in order to then give the peak value, which is provided by the fifth signal U5.

As shown in FIG. 3, the first signal U1, the fourth signal, and the fifth signal U5 are spliced by means of means 3 for splicing into the desired signal U(I_L), which emulates the current via the power inductor. In this case, an auxiliary value Uh is first subtracted, by means of a subtractor 31 of the means for splicing, by subtraction of the fifth signal U5 from the first signal U1. The auxiliary value is then added to the fourth signal U4, and the sum of the fourth signal U4 and the auxiliary signal Uh forms the signal U(I_L) which emulates the current via the power inductor L1.

The controller means S preferably has an input which indicates the direction of the transmission of energy through the DC-to-DC converter. In addition, the controller means S can have an input via which a pulse-width modulated signal PWM is fed to the controller means. This signal PWM can be generated by a PW modulator M from the signal U (I_L) which emulates the current through the power inductor L1 and a control signal.

LIST OF REFERENCE NUMBERS

N1 first input and output of the DC-to-DC converter
N2 second input and output of the DC-to-DC converter
C1 capacitor of the DC-to-DC converter on the N1 side
C2 capacitor of the DC-to-DC converter on the N2 side
D1 diode of the DC-to-DC converter
D2 diode of the DC-to-DC converter
W1 controllable switch element of the DC-to-DC converter
W2 controllable switch element of the DC-to-DC converter
L1 power inductor of the DC-to-DC converter
R current sensing resistor
OTA1*a*, transconductance amplifier
OTA1*b*
R3 resistor for current-voltage conversion
C3 smoothing capacitor
sw_boost, controllable switch elements
sw_buck
P nodes of the DC-to-DC converter
G1 controllable current source
C integrator capacitor
SW_C controllable switch element
D detector for detecting the oscillation width
OP4 operational amplifier for generating the peak value
1 first means for generating the first signal U1
11 first elements of the first means for generating the third signal U3
2 second means for generating the second signal U2 or for generating components of the second signal U2
21 elements of the second means for generating the third signal U3
22 elements of the second means for integrating and generating the fourth signal U4
23 elements of the second means for generating the fifth signal U5
K first node in the elements of the second means for generating the third signal U3
3 means for splicing the constant component (first signal U1) and the alternating component (second signal U2) and/or the first signal U1 and the components of the second signal U2
31 subtractor
32 adder
U1 to U5 first to fifth signal
Uh auxiliary signal
S control means
M PWM modulator

The invention claimed is:

1. A circuit for the purpose of at least partially emulating a current via a power inductor of a DC-to-DC converter, particularly of a bidirectional DC-to-DC converter having a first input and/or output for the purpose of connection to a first power grid, and having a second input and/or output for the purpose of connection to a second power grid, wherein the circuit has first means for generating a first signal, said means detecting or emulating the constant component of the current via the power inductor, wherein the first means have first elements for generating the first signal, second means for generating a second signal or components of the second signal, said second means emulating the alternating component of the current via the power inductor, and third means for splicing the first signal and the second signal, or the first signal or the components of the second signal, into a signal which at least partially emulates the current via the power inductor, characterized in that the first elements of the first means comprise a current sensing resistor, wherein the current sensing resistor is connected on the one hand to the power inductor and a first capacitor, and on the other hand to the first input and output.

2. The circuit according to claim 1, characterized in that the first elements of the first means have two transconductance amplifiers connected in antiparallel, wherein a voltage which drops across the current sensing resistor is fed to said transconductance amplifiers.

3. The circuit according to claim 2, characterized in that the outputs of the transconductance amplifiers can be converted to a voltage via one or more converter elements, wherein this voltage can be tapped as a first signal at the converter element or converter elements.

4. The circuit according to claim 1, characterized in that the second means has elements for generating a third signal from voltages applied to the first input and/or output and/or to the second input and/or output.

5. The circuit according to claim 4, characterized in that the second means elements can be controlled in such a manner that, during boost operation, the third signal can be generated from a voltage applied at the first input and/or output, and/or, during buck operation, the third signal can be generated from a difference of the voltages between the first input and/or output and the second input and/or output.

6. The circuit according to claim 4, characterized in that the second means has elements for integrating the third signal, by means of which it is possible to generate a fourth signal.

7. The circuit according to claim 6, characterized in that the second means have elements for generating a fifth signal from the fourth signal, which emulates a peak value of the alternating component of the current via the power in-ductor.

8. The circuit according to claim 6, characterized in that the elements have a parallel circuit consisting of a controllable switch element and a capacitor, for the purpose of integrating a current source which can be controlled by the third signal and a current source which is controlled in series.

9. The circuit according to claim 1, characterized in that the third means have elements for subtracting the fifth signal from the first signal for the purpose of generating an auxiliary signal.

10. A circuit arrangement consisting of a DC-to-DC converter, particularly a bidirectional DC-to-DC converter, for example a bidirectional synchronous converter, and a circuit for emulating a current via a power inductor of the DC-to-DC converter, characterized in that the circuit which emulates the current is designed according to claim 1.

* * * * *